(12) United States Patent
Chung et al.

(10) Patent No.: US 8,372,702 B2
(45) Date of Patent: Feb. 12, 2013

(54) METHOD OF MANUFACTURING TFT AND ARRAY TFT

(75) Inventors: Jae-woo Chung, Yongin-si (KR);
Seung-ho Lee, Suwon-si (KR);
Young-ki Hong, Anyang-si (KR);
Sung-gyu Kang, Suwon-si (KR);
Joong-hyuk Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 129 days.

(21) Appl. No.: 12/923,051

(22) Filed: Aug. 31, 2010

(65) Prior Publication Data
US 2011/0183478 A1    Jul. 28, 2011

(30) Foreign Application Priority Data
Jan. 22, 2010  (KR) .................. 10-2010-0006053

(51) Int. Cl.
*H01L 21/84* (2006.01)
*H01L 51/40* (2006.01)
(52) U.S. Cl. ................... 438/158; 438/99; 438/151
(58) Field of Classification Search .............. 438/99, 438/151, 158
See application file for complete search history.

(56) References Cited

U.S. PATENT DOCUMENTS

| | | | |
|---|---|---|---|
| 6,599,582 B2 * | 7/2003 | Kiguchi et al. | 427/466 |
| 6,808,972 B2 | 10/2004 | Sirringhaus et al. | |
| 7,575,774 B2 * | 8/2009 | Suzuki et al. | 427/58 |
| 2005/0026317 A1 | 2/2005 | Sirringhaus et al. | |
| 2006/0110847 A1 * | 5/2006 | Fujimori et al. | 438/99 |
| 2006/0286726 A1 * | 12/2006 | Sirringhaus et al. | 438/151 |
| 2007/0046718 A1 * | 3/2007 | Shintate et al. | 347/21 |
| 2008/0246089 A1 * | 10/2008 | Ko et al. | 257/347 |
| 2011/0233535 A1 * | 9/2011 | Zuberi et al. | 257/40 |

FOREIGN PATENT DOCUMENTS

| | | |
|---|---|---|
| JP | 2005-217359 | 8/2005 |
| JP | 2007-279081 | 10/2007 |
| JP | 2009-152598 | 7/2009 |
| KR | 10-2006-0114251 | 11/2006 |
| KR | 10-2007-0063300 | 6/2007 |
| KR | 10-2007-0080964 | 8/2007 |
| KR | 10-2008-0090134 | 10/2008 |

* cited by examiner

*Primary Examiner* — Luan C Thai
(74) *Attorney, Agent, or Firm* — Harness, Dickey & Pierce, P.L.C.

(57) ABSTRACT

A method of manufacturing a thin film transistor includes sequentially forming a gate and at least one insulation layer on a substrate, forming a source electrode and a drain electrode on the at least one insulation layer, and forming a channel layer formed of a semiconductor on a part of the source electrode and the drain electrode, wherein the gate, the source electrode, and the drain electrode are formed by using a hybrid inkjet printing apparatus.

9 Claims, 8 Drawing Sheets

METHOD OF MANUFACTURING TFT AND ARRAY TFT

CROSS-REFERENCE TO RELATED APPLICATIONS

This application claims priority under U.S.C §119 to Korean Patent Application No. 10-2010-0006053, filed on Jan. 22, 2010, in the Korean Intellectual Property Office (KIPO), the entire contents of which are incorporated herein by reference.

BACKGROUND

1. Field

The present disclosure relates to methods for manufacturing a thin film transistor (TFT) and an array TFT, and more particularly, to methods for manufacturing a TFT and an array TFT by using a hybrid inkjet printing apparatus capable of ejecting a fine droplet.

2. Description of the Related Art

Thin film transistors (TFTs) are used in a variety of applied fields, in particular, in a display field as a switching and driving device. Photolithography has been established as technology for manufacturing the TFT. The photolithography is limited in using a functional material having conductivity and semiconductivity due to a deposition process. Also, when the photolithography is applied to a flexible substrate, misalignment may be generated due to a high deposition temperature so that process accuracy may be deteriorated and process costs may be high. To address the above issues, printing technology is employed gradually and increasingly as a replacement technology for the photolithography.

Many methods have been developed and applied for the printing technology. Among the many methods, an inkjet technology having a substrate non-contacting characteristic is evaluated as one of major innovative technologies. Accordingly, a lot of research activities have been performed globally due to its importance and usability.

A contact type printing is widely known as a method for implementing a TFT by printing. According to the contact type printing, when a new layer is formed on an already formed underlayer, liquid is printed by contacting the underlayer so that mechanical deformation or contamination may be easily generated in the substrate or underlayer. Also, if roughness of a printed surface is high or a printing area is large, printing is difficult because the printing area is determined according to the size of a mold.

Thus, a non-contact type inkjet printing technology is used to overcome the demerit of the contact type printing method. The non-contact type inkjet printing technology may form a variety of patterns by using a single printing apparatus and may prevent contamination between layers. An inkjet printing apparatus used for the non-contact type inkjet printing technology prints a predetermined image by ejecting a fine ink droplet at a desired position on a print medium.

The inkjet printing apparatus includes a piezoelectric inkjet printing apparatus for ejecting ink by using the deformation of a piezoelectric material and an electrostatic inkjet printing apparatus for ejecting ink by an electrostatic force, according to the type of ejection. The electrostatic inkjet printing apparatus includes a type of ejecting an ink droplet by electrostatic induction and a type of ejecting an ink droplet by accumulating charged pigments by an electrostatic force.

The piezoelectric inkjet printing apparatus has a difficulty in implementing an ultrafine droplet having a size smaller than several picoliters. Also, this printing apparatus has a problem in that an ink droplet does not accurately arrive at a desired position compared to the electrostatic inkjet printing apparatus. The electrostatic inkjet printing apparatus may implement an ultrafine droplet, employ a simple driving method, and exhibit superior directivity of an ejected ink droplet, which is suitable for precision printing. However, the electrostatic inkjet printing apparatus employing an electrostatic induction method have a demerit in that individual ink paths are difficult to form so that it may be difficult to eject ink from a plurality of nozzles by a drop-on-demand (DOD) method.

Thus, since precision printing of electrode and semiconductor liquid materials is made possible by employing a hybrid type inkjet printing technology having merits of both applied printing mechanism with apparatus, the printing is not affected by the type of substrate and printing technologies for forming a variety of patterns may be employed.

SUMMARY

Provided are methods for manufacturing a thin film transistor (TFT) and an array TFT by using a hybrid inkjet printing apparatus.

Additional aspects will be set forth in part in the description which follows and, in part, will be apparent from the description, or may be learned by practice of the presented embodiments.

According to an aspect of the present invention, a method of manufacturing a thin film transistor includes sequentially forming a gate and at least one insulation layer on a substrate, forming a source electrode and a drain electrode on the at least one insulation layer, and forming a channel layer formed of a semiconductor on the source electrode and the drain electrode, wherein the gate, the source electrode, and the drain electrode are formed by using a hybrid inkjet printing apparatus.

According to another aspect of the present invention, a method of manufacturing an array thin film transistor by using the above method of manufacturing a thin film transistor.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Various example embodiments will now be described more fully with reference to the accompanying drawings in which example embodiments are shown. Example embodiments may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Figure 1:
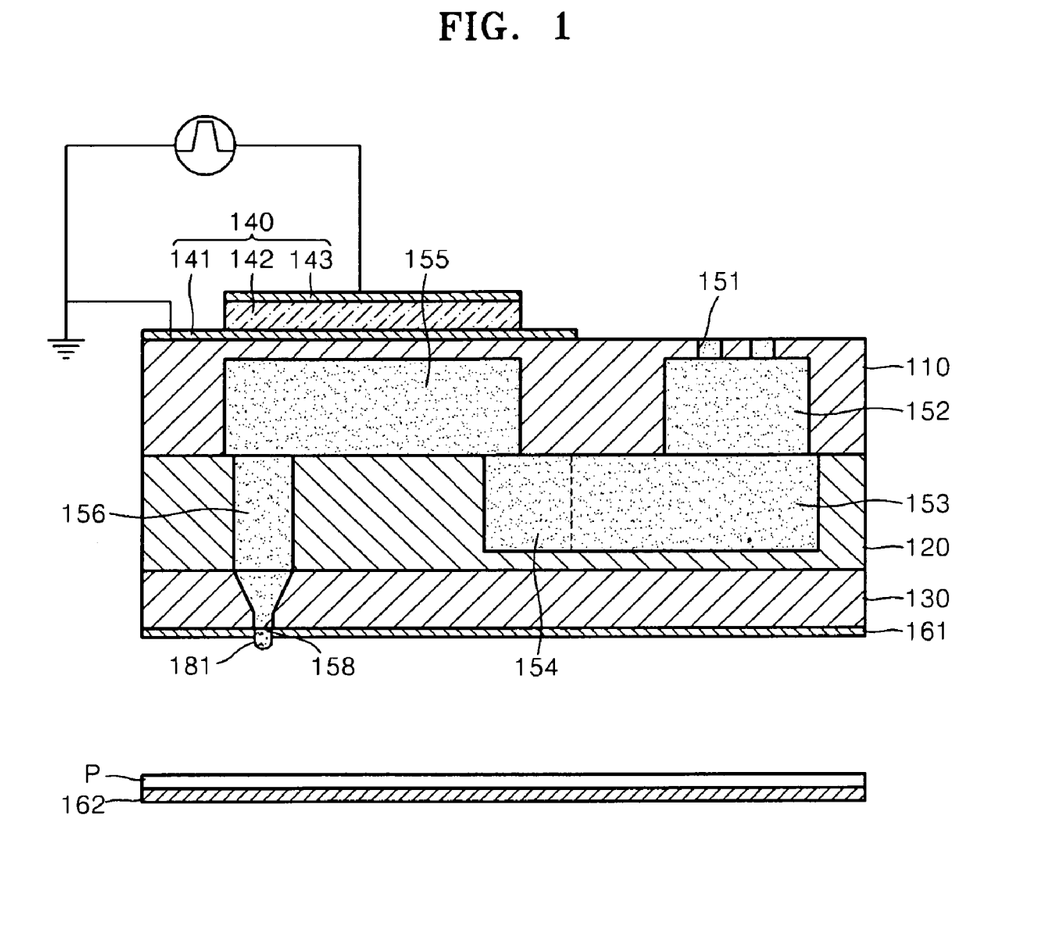
FIGS. 1 and 2 are cross-sectional views for explaining a driving method of a hybrid inkjet printing apparatus according to an embodiment of the present invention.
Figure 2:
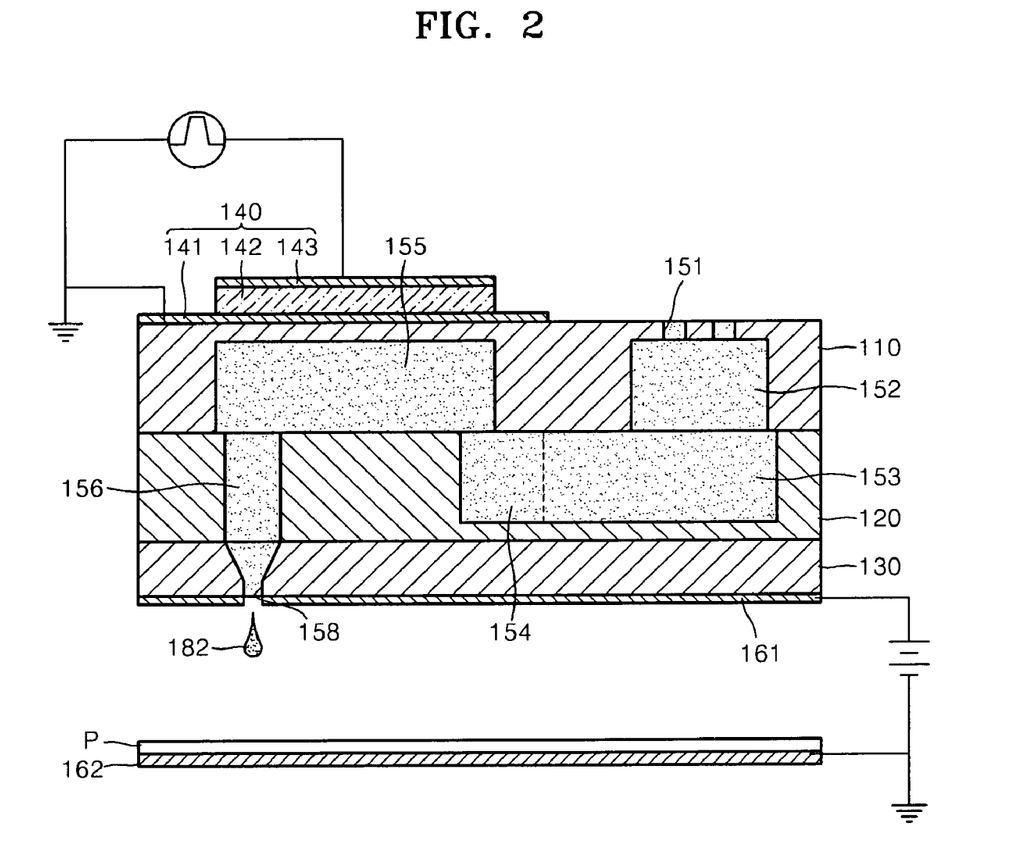

FIGS. 1 and 2 are cross-sectional views for explaining a driving method of a hybrid inkjet printing apparatus according to an embodiment of the present invention. Referring to FIG. 1, the hybrid inkjet printing apparatus according to the present embodiment includes a flow path plate where an ink flow path may be formed, a piezoelectric actuator 140 provided on the flow path plate, and first and second electrostatic electrodes 161 and 162 separated from each other for forming electrostatic field therebetween.

The flow path plate may include three combined substrates of first, second, and third substrates 110, 120, and 130. A pressure chamber 155 filled with ink to be ejected may be formed in the first substrate 110. The first substrate 110 forming an upper wall of the pressure chamber 155 may be deformed by being driven by the piezoelectric actuator 140 to function as a vibration plate that generates a pressure in the pressure chamber 155. A manifold 153 for supplying ink to the pressure chamber 155 and a restrictor 154 connecting the manifold 153 and the pressure chamber 155 may be formed in the second substrate 120. A nozzle 158 for ejecting ink may be formed in the third substrate 130. An ink inlet 152 through which ink is externally input to the manifold 153 may be further formed in the first substrate 110. At least one through hole 151 through which ink is externally input to the ink inlet 152 may be formed in the upper wall of the first substrate 110. A damper 156 connecting between the pressure chamber 155 and the nozzle 158 may be further formed in the second substrate 120.

The piezoelectric actuator 140 may be provided on an upper surface of the flow path plate located above the pressure chamber 155. The piezoelectric actuator 140 may be provided corresponding to the pressure chamber 155 to drive the first substrate 110 above the pressure chamber 155, in detail, a portion of the first substrate 110 corresponding to the upper surface of the pressure chamber 155, to be deformed. The piezoelectric actuator 140 may include a lower electrode 141, a piezoelectric film 142, and an upper electrode 143, which are sequentially deposited on and above an upper surface of the flow path plate. The lower electrode 141 functions as a common electrode and the upper electrode 143 functions as a drive electrode for applying a voltage to the piezoelectric film 142. As the piezoelectric film 142 is deformed by the application of a voltage, the portion of the first substrate 110 corresponding to the upper surface of the pressure chamber 155 is accordingly deformed so that the pressure chamber 155 may be compressed. The piezoelectric film 142 may be formed of a predetermined piezoelectric material, for example, a lead zirconate titanate (PZT).

The first electrostatic electrode 161 may be formed on the lower surface of the third substrate 130. A second electrostatic electrode 162 is separated a predetermined distance from the first electrostatic electrode 161 on the lower surface of the third substrate 130. A recording medium P on which ink droplets ejected from the nozzle 158 of the flow path plate may be loaded on the second electrostatic electrode 162.

A method of driving the hybrid inkjet printing apparatus, in which the piezoelectric actuator and the electrostatic field are combinedly used, will be described below with reference to the accompanying drawings.

First, referring to FIG. 1, the piezoelectric actuator 140 is driven by applying a predetermined piezoelectric driving pulse between the lower electrode 141 and the upper electrode 143. The piezoelectric driving pulse is applied between the lower electrode 141 and the upper electrode 143 as much as ink in the nozzle 158 protrudes outside the nozzle 158, without being completely ejected out of the nozzle 158. As the predetermined piezoelectric driving pulse is applied between the lower electrode 141 and the upper electrode 143, a meniscus 181 of ink in the nozzle 158 protrudes outside the nozzle 158 toward the second electrostatic electrode 162.

Next, referring to FIG. 2, in the state in which the piezoelectric driving pulse is applied between the lower electrode 141 and the upper electrode 143, as illustrated in FIG. 1, an electrostatic field driving pulse is applied between the first electrostatic electrode 161 and the second electrostatic electrode 162. Accordingly, as a predetermined electrostatic field is generated between the first electrostatic electrode 161 and the second electrostatic electrode 162, the ink protruding outside the nozzle 158 due to the electrostatic field is ejected in form of a droplet 182 toward the second electrostatic electrode 162. The ejected ink droplet 182 arrives at a desired position on the recording medium P. The hybrid inkjet printing apparatus may implement an ultrafine droplet having a size smaller than several picoliters and simultaneously accurately print the ejected droplet on a desired position on the recording medium P.

The hybrid inkjet printing apparatus may eject ink from the inside of the nozzle 158 by applying a predetermined piezoelectric driving pulse between the lower electrode 141 and the upper electrode 143 to drive only the piezoelectric actuator 140.

The hybrid inkjet printing apparatus according to the present embodiment is not limited to those illustrated in FIGS. 1 and 2. The first electrostatic electrode 161 may be provided at a variety of positions inside the flow path plate. For example, the first electrostatic electrode 161 may be formed only on the bottom surface of the pressure chamber 155, or on the bottom surface of the restrictor 154 or the manifold 153.

The hybrid inkjet printing technology as described above has the following merits.

First, a desired pattern (a line or a dot) may be formed by ejecting ink without contacting a substrate. When layers are deposited step by step in an apparatus having a multilayered structure, such as a thin film transistor (TFT), a pattern may be formed without deforming the already formed underlayer.

Second, the shape of printing may be freely changed by adjusting the amount of the ink droplet ejected from the nozzle forming an inkjet head.

Third, the pattern width of several microns required by the TFT may be formed by forming the droplet of the ejected ink in a picoliter size.

Fourth, an expensive apparatus is not needed compared to a TFT forming method that uses a photolithography or deposition method using a mask. Since the number of processes may be remarkably reduced, the printing material is less consumed so that an apparatus may be manufactured at a low cost.

Fifth, since the present invention employs a non-contact printing technology which may be applied not only to a substrate, such as glass, having a high Young's modulus but also to a flexible substrate such as plastic, no ill effect, such as, the deformation of a substrate or the contamination of each interlayer, is generated.

Sixth, a pattern may be conformally formed without an effect to the formation of a surface of a substrate.

Figure 3:
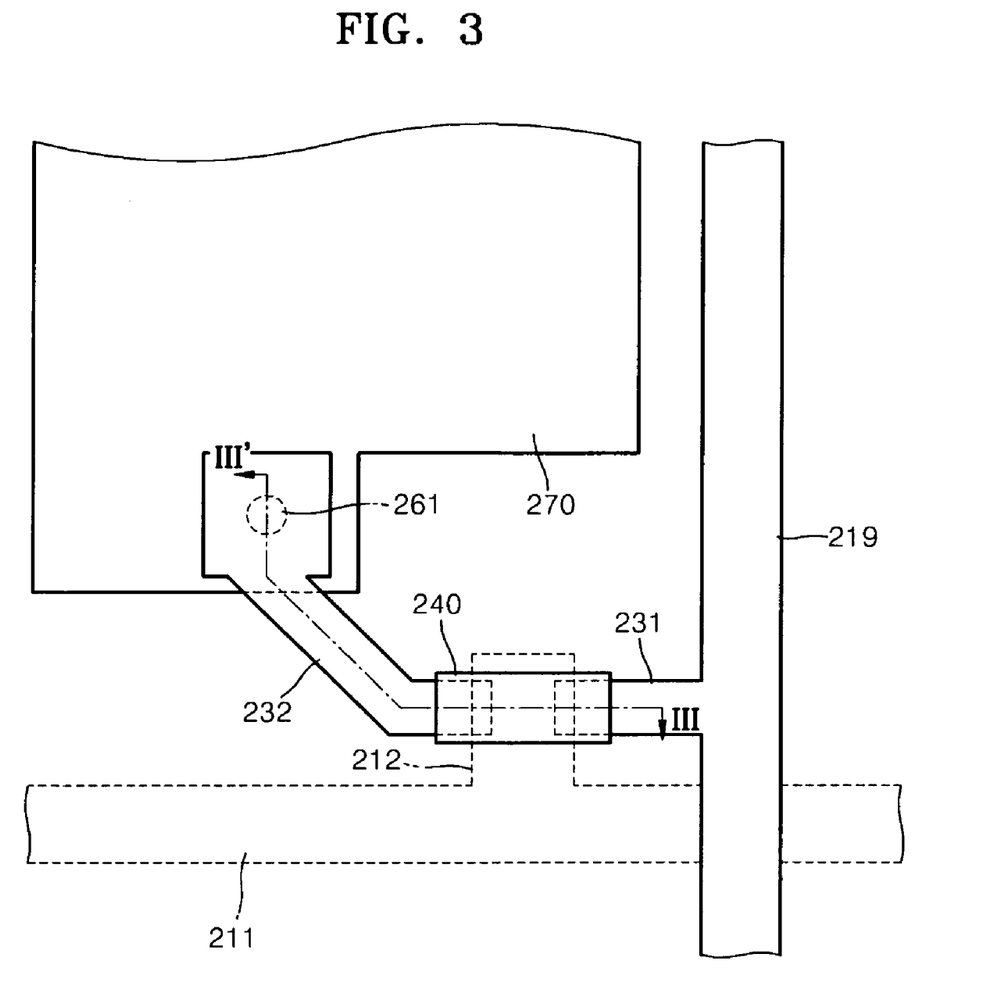
FIG. 3 is a plan view of a TFT applied to a pixel unit of a display apparatus.
Figure 4:
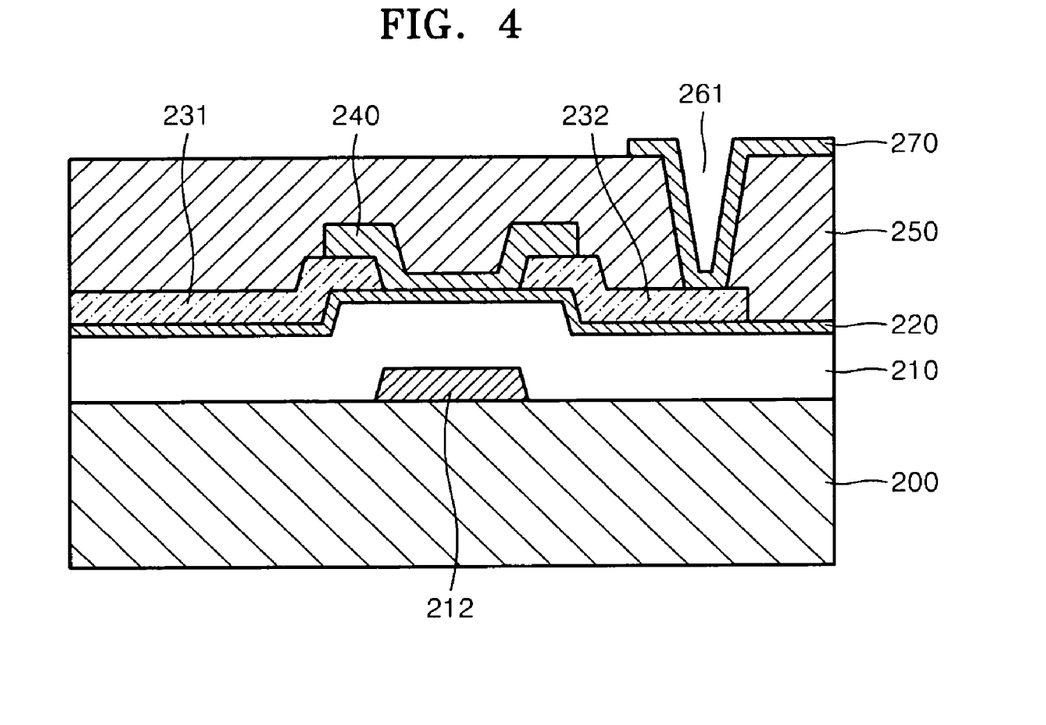
FIG. 4 is a cross-sectional view taken along line III-III' of FIG. 3.

FIG. 3 is a plan view of a TFT applied to a pixel unit of a display apparatus. FIG. 4 is a cross-sectional view taken along line III-III' of FIG. 3.

Referring to FIGS. 3 and 4, a gate 212 and a gate line 211 are formed on a substrate 200. The gate line 211 is electrically connected to the gate 212 to apply a predetermined voltage to the gate 212. A first gate insulation layer 210 that is formed of an organic insulation material is formed on the substrate 200 to cover the gate 212 and the gate line 211. A second gate insulation layer 220 that is formed of an inorganic insulation material may be formed on the first gate insulation layer 210. The first gate insulation layer 210 formed of an organic insulation material may be thicker than the second gate insulation layer 220 formed of an inorganic insulation material.

A source electrode 231 and a drain electrode 232 are formed on the second gate insulation layer 220 above the gate 212 to be separated a predetermined distance from each other. The source electrode 231 is electrically connected to a data line 219. A channel layer 240 is formed of a semiconductor material in a predetermined thickness to cover the second gate insulation layer 220 exposed between the source electrode 231 and the drain electrode 232 and a part of the source electrode 231 and the drain electrode 232. A source insulation layer 250 is formed in a predetermined thickness on the first gate insulation to cover the source electrode 231, the channel layer 240, and the drain electrode 232. The source insulation layer 250 may be formed to have a different thickness from the first gate insulation layer 210. The source insulation layer 250 may be thinner than the first gate insulation layer 210.

A pixel electrode 270 may be formed on the source insulation layer 250 to be electrically connected to the drain electrode 232. To this end, as illustrated in FIG. 4, a via hole 261 exposing the drain electrode 232 may be formed in the source insulation layer 250 formed above the drain electrode 232. The pixel electrode 270 is electrically connected to the drain electrode 232 via the via hole 261. The pixel electrode 270 may include indium tin oxide (ITO) or indium zinc oxide (IZO) and may be formed of an organic or inorganic transparent conductive material. The pixel electrode 270 may be formed simultaneously with the source insulation layer 250. In this case, the pixel electrode 270 may be formed of the same material as that of source electrode 231 or drain electrode 232.

A method of manufacturing a TFT by using the hybrid inkjet printing apparatus according to an embodiment of the present invention will be described below. FIGS. 5-13 are cross-sectional views for explaining a method of manufacturing a TFT according to an embodiment of the present invention.

Figure 5:
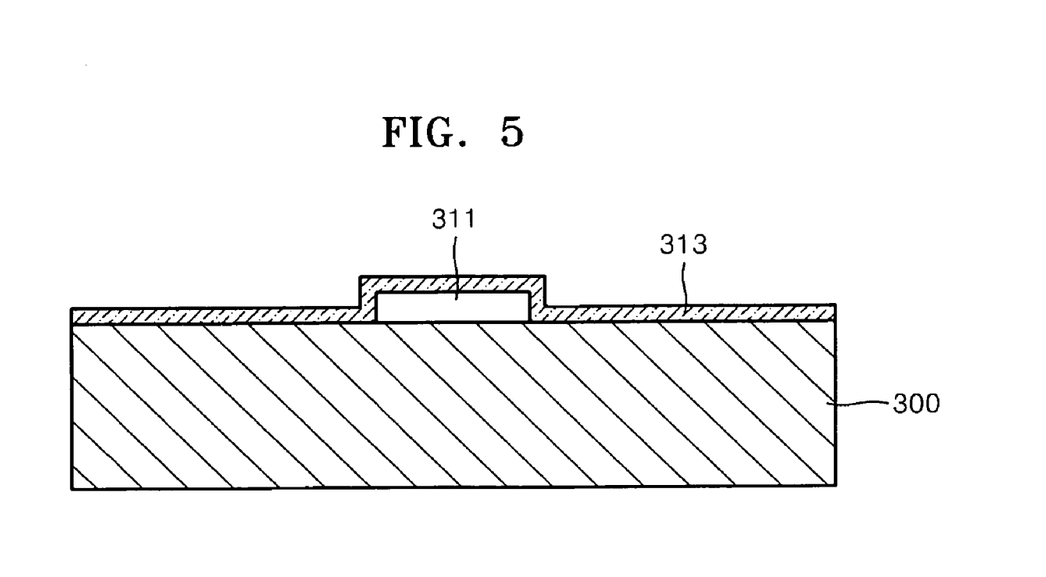
FIGS. 5-13 are cross-sectional views for explaining a method of manufacturing a TFT according to an embodiment of the present invention.
Figure 7:
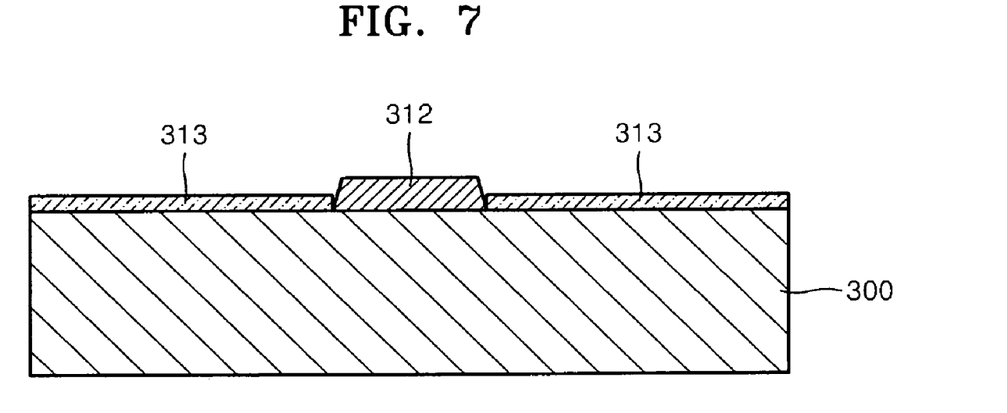

Referring to FIG. 5, a photoresist (PR) 311 is formed at a line portion, where a gate 312 of FIG. 7 is to be formed, by being printed on a cleaning-processed glass or plastic substrate 300. A self assembled monolayer (SAM) 313 is formed by using an organic material at the outside of the line portion to be printed.

Figure 6:
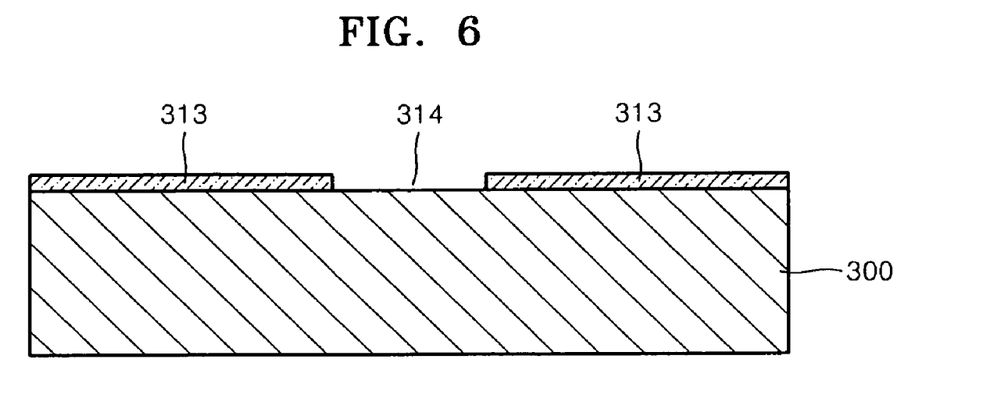

Referring to FIG. 6, the PR 311 is removed together with the SAM 313 coated on the PR 311. Accordingly, since the SAM 313 no longer remains on a portion 314 where the PR 311 is removed, a surface of the substrate 300 is exposed through the portion 314. Thus, the portion 314 has different surface energy from the portion coated with the SAM 313. Since the portion where the PR 311 is removed has a relatively organic or water-based ink-philic characteristic, compared to the SAM coated portion, confinement of a pattern printed on the portion 314 is easily achieved. Thus, due to the difference in the surface energy between the SAM coated portion 313 and the portion 314 where the PR 311 is removed, line may be uniformly made and printing may be accurately performed at a desired position when electrode solution is printed.

Also, without passing the above-described pre-pattern process, the electrode solution may be directly printed at a desired position to have a desired shape.

Referring to FIG. 7, a pattern is formed by printing conductive ink in a fine droplet having a volume of about 0.1-4 pl on the portion 314 of FIG. 6 where the PR is removed by using the hybrid inkjet printing apparatus. The pattern is treated by heat at a predetermined temperature, thereby forming the gate 312 having conductivity. The width and the thickness of the printed pattern are maintained to be respectively about 3-50 μm and about 0.1-5 μm. In the present invention, the width and thickness of the pattern are not limited thereto. The conductive ink may be printed a plurality of times on the same pattern according to the solute content of the conductive ink. In this process, the gate line 211 of FIG. 3 electrically connected to the gate 212 of FIG. 3 may be formed together on the substrate 300.

Figure 8:
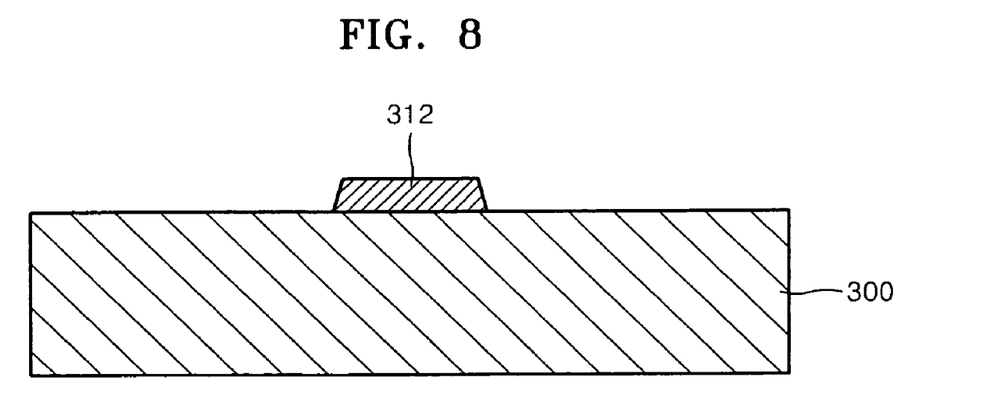

Referring to FIG. 8, the SAM 313 of FIG. 7 formed around the gate 312 may be removed by a dry etching method or a wet etching method.

Figure 9:
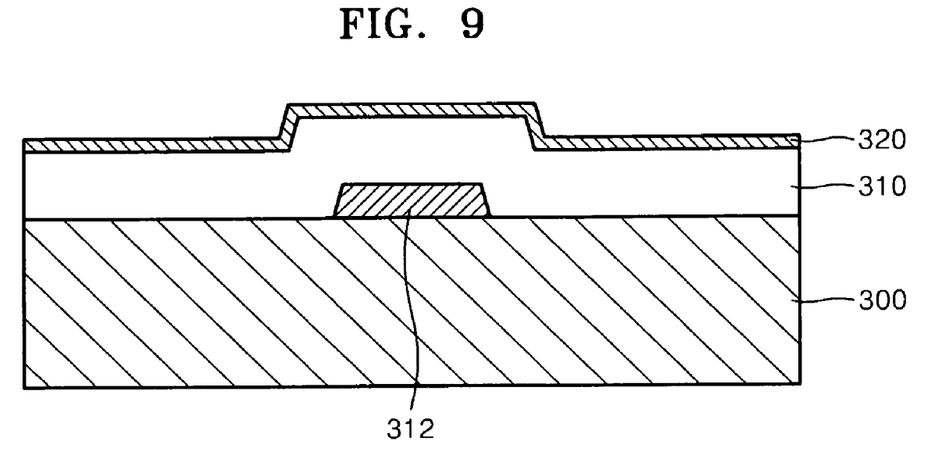

Referring to FIG. 9, a first gate insulation layer 310 may be formed on the substrate 300 using an organic insulation material to cover the gate 312. A second gate insulation layer 320 may be formed on the first gate insulation layer 310 using an inorganic insulation material. The first gate insulation layer 310 may be thicker than the second gate insulation layer 320.

As an insulation material, an insulation layer material having a dielectric constant of about 2 or higher may be coated by using spin coating, spray coating, or a low temperature deposition process. Also, when a plasma-enhanced chemical vapour deposition (PECVD) is needed to improve an insulation layer characteristic or assist ordering of a semiconductor material in a particular direction, a dual layer may be formed by coating with Si oxide or nitrided oxide. When an insulation material that is a solution is in use, an insulation layer may be formed by printing using the hybrid inkjet printing apparatus to maintain a constant shape only in a desired portion of the upper portion of the gate.

Figure 10:
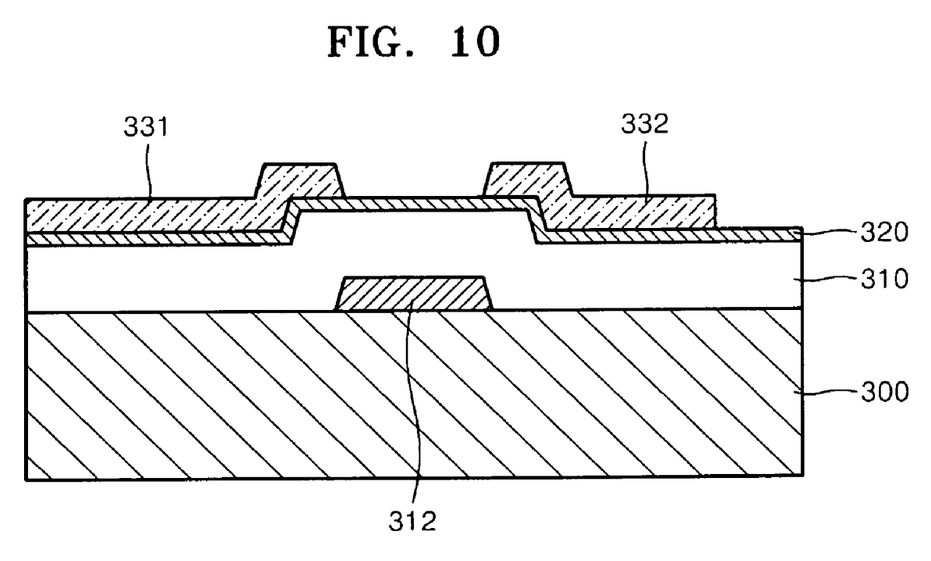

Referring to FIG. 10, a pattern may be formed on the second gate insulation layer 320 by conductive ink in a fine droplet having a volume of about 0.1-4 pl by using the hybrid inkjet printing apparatus. The pattern may be treated by heat at a predetermined temperature so that the source electrode 331 and the drain electrode 332 may be simultaneously formed. The width and the thickness of the printed pattern are maintained to be respectively about 3-50 μm and about 0.1-5 μm. In the present invention, the width and the thickness of the printed pattern are not limited thereto. The source electrode 331 and the drain electrode 332 are separated a predetermined distance from each other on the second gate insulation layer 320 when the source electrode 331 and the drain electrode 332 are formed, the pattern may be uniformly formed and accurately printed at a desired position by using the method used for forming the gate 312 of FIGS. 5-7, that is, the method of forming a pre-pattern by coating SAM.

Figure 11:
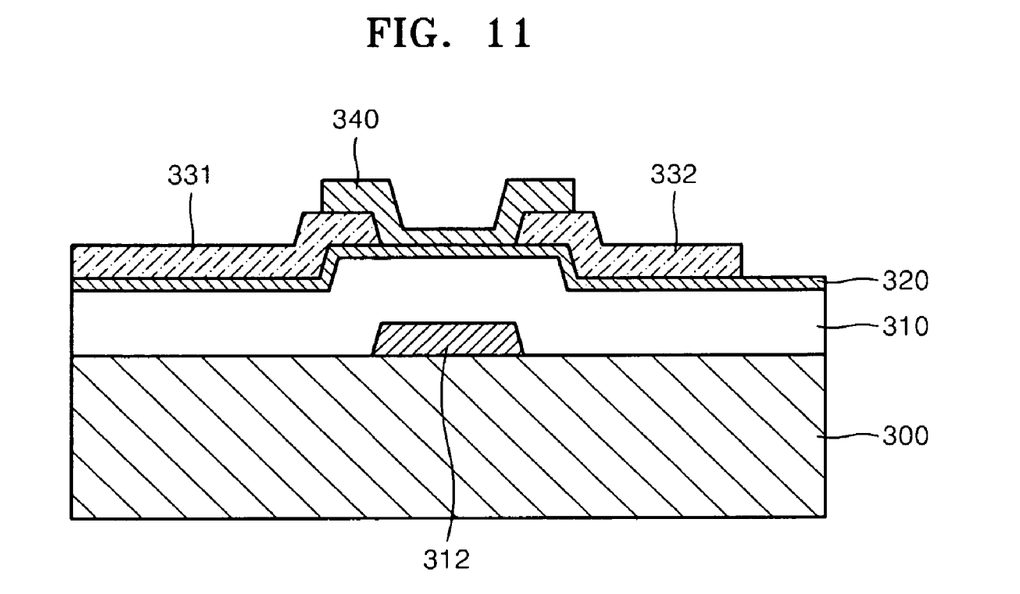

Referring to FIG. 11, the channel layer 340 is formed on a part of the source electrode 331 and the drain electrode 332, and the second gate insulation layer 320 exposed between the source electrode 331 and the drain electrode 332, to a predetermined thickness with the organic or inorganic semiconductor material in a fine droplet having a volume of about 0.1-4 pl by using the hybrid inkjet printing apparatus. When the organic semiconductor is to be printed, to improve an organic semiconductor characteristic during the heat treatment, the organic semiconductor may be printed after performing hydrophobic coating on the source electrode 331 and the drain electrode 332 and the second gate insulation layer 320 therebetween.

In the above description, the channel layer 340 is formed after the source electrode 331 and the drain electrode 332 are formed. However, after the channel layer 340 is first formed, the source electrode 331 and the drain electrode 332 may be formed at the opposite sides of the upper surface of the channel layer 340.

The channel layer 340 may be formed by using only a piezoelectric actuator without using the hybrid inkjet printing method. The channel layer 340 functions as a bridge to electrically connect the source electrode 331 and the drain electrode 332. Since the channel layer 340 does not require precise width like the gate 312, source electrode 331, and the drain electrode 332, the channel layer 340 may be formed by ejecting ink droplets using the piezoelectric actuator only without using the hybrid inkjet printing method.

Figure 12:
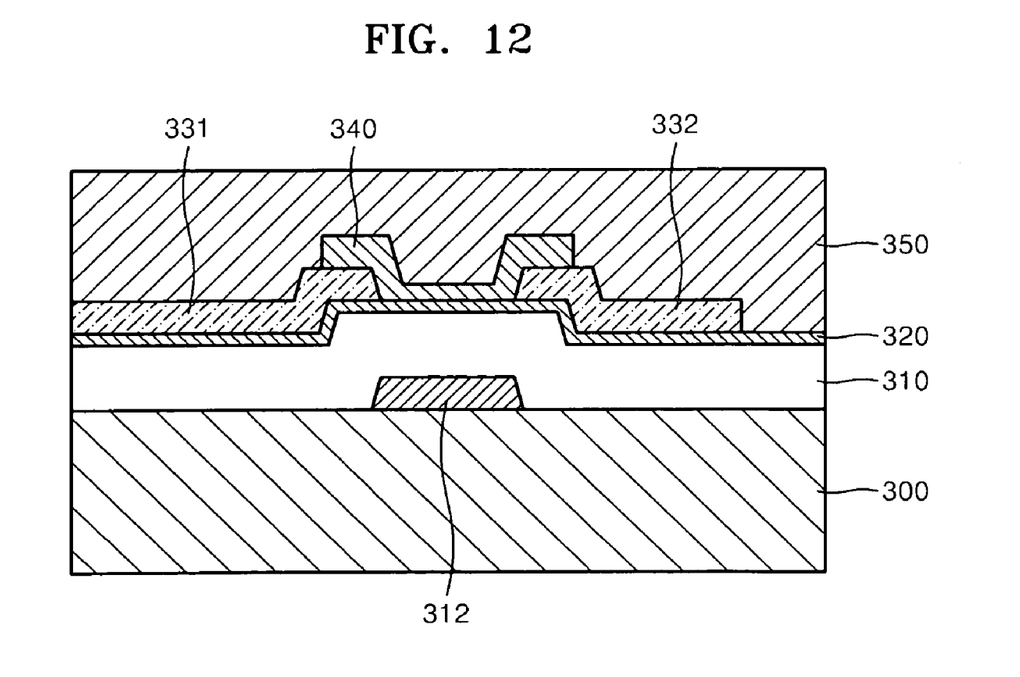

Referring to FIG. 12, the source insulation layer 350 may be formed to cover the channel layer 340, the source electrode 331, and the drain electrode 332. The source insulation layer 350 may be formed by coating an organic or inorganic material using spin coating, spray coating, or a low temperature deposition process. The source insulation layer 350 functions to prevent deterioration of the characteristics of the channel layer 340, the source electrode 331, and the drain electrode 332 due to oxygen or moisture in the air. The source insulation layer 350 may have a different thickness from that of the first gate insulation layer 310 or the second gate insulation layer 320.

Figure 13:
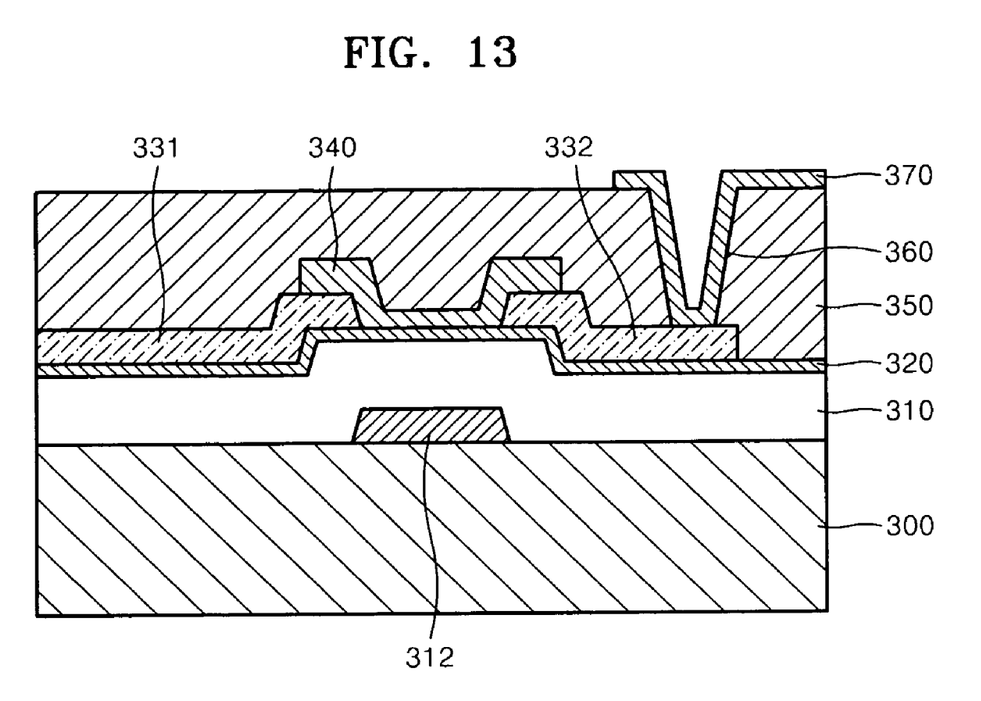

Referring to FIG. 13, a via hole 360 exposing the drain electrode 332 may be formed by etching the source insulation layer 350 located above the drain electrode 332. A pixel electrode 370 may be formed on the inner wall of the via hole 360. Thus, the pixel electrode 370 is connected to the drain electrode 332 by means of the via hole 360.

In the above description, a TFT of a bottom-gate structure in which the gate 312 is provided under the channel layer 340 is described. However, the present invention is not limited thereto and a TFT of a top-gate structure in which the gate 312 is provided above the channel layer 340 may be employed.

Also, in the above description, a unit TFT is manufactured by using the hybrid inkjet printing method. However, an array type TFT, in which a plurality of unit TFTs are combined, may be manufactured by using the hybrid inkjet printing method in the same manner as the method of manufacturing a unit TFT, although a difference exists in the designed structure in addition to the increase in the number of unit TFTs.

While example embodiments have been shown and described with reference to the accompanying drawings, the scope of the present application should not be construed as being limited to example embodiments. Descriptions of features or aspects within each embodiment should typically be considered as available for other similar features or aspects in other embodiments.

What is claimed is:

1. A method of manufacturing a thin film transistor, the method comprising:

sequentially forming a gate, a first insulation layer covering a top surface of the gate and side surfaces of the gate, and a second insulation layer directly on the first insulation layer on a substrate, the first insulation layer including an organic insulation material and the second insulation layer including an inorganic insulation material;

forming a source electrode and a drain electrode on the second insulation layer;

forming a channel layer formed of a semiconductor on a part of the source electrode and the drain electrode; and forming a pre-pattern using a self-assembled monolayer before forming the gate, the source electrode, and the drain electrode, wherein at least one of the gate, the source electrode, and the drain electrode is formed by using a hybrid inkjet printing apparatus.

2. The method of claim 1, wherein, when the gate, the source electrode, and the drain electrode are formed, the volume of a droplet ejected from the hybrid inkjet printing apparatus is about 0.1-4 pl.

3. The method of claim 2, wherein the width of each of the gate, the source electrode, and the drain electrode is about 3-50 μm.

4. The method of claim 3, wherein the thickness of the gate is about 0.1-5 μm.

5. The method of claim 3, wherein the thickness of each of the source electrode and the drain electrode is about 0.1-2 μm.

6. The method of claim 1, wherein the channel layer is formed by using the hybrid inkjet printing apparatus, and when the channel layer is formed, the volume of a droplet ejected from the hybrid inkjet printing apparatus is about 1-10 pl.

7. The method of claim 1, wherein the channel layer is formed by forming and printing a droplet through driving of a piezoelectric actuator.

8. The method of claim 1, wherein, in the hybrid inkjet printing apparatus, a piezoelectric actuator and an electrostatic field are combined and selectively employed as a driving method.

9. A method of manufacturing an array thin film transistor by using the method of manufacturing a thin film transistor defined by claim 1.

* * * * *